US006671957B2

United States Patent
Diels

(10) Patent No.: US 6,671,957 B2
(45) Date of Patent: Jan. 6, 2004

(54) METHOD OF THE MANUFACTURE OF COOLING DEVICES

(76) Inventor: Manfred Diels, Hohbüschener Weg 1, D-58540 Meinerzhagen (DE)

( * ) Notice: Subject to any disclaimer, the term of this patent is extended or adjusted under 35 U.S.C. 154(b) by 0 days.

(21) Appl. No.: 10/224,935

(22) Filed: Aug. 21, 2002

(65) Prior Publication Data

US 2003/0041456 A1 Mar. 6, 2003

(30) Foreign Application Priority Data

Aug. 28, 2001 (DE) .......................... 101 41 988

(51) Int. Cl.[7] .............................................. B23P 15/26
(52) U.S. Cl. ...................... 29/890.03; 29/509; 165/80.3; 165/185
(58) Field of Search ............................. 29/890.03, 509, 29/514, 515; 165/803, 185; 361/704, 710

(56) References Cited

U.S. PATENT DOCUMENTS

| | | | | |
|---|---|---|---|---|
| 3,735,465 A | * | 5/1973 | Tibbetts et al. | 29/726 |
| 5,042,257 A | * | 8/1991 | Kendrick et al. | 62/3.1 |
| 5,193,498 A | * | 3/1993 | Futami | 123/90.31 |
| 5,282,364 A | * | 2/1994 | Cech | 62/3.2 |
| 5,689,873 A | * | 11/1997 | Luhm | 29/525.11 |
| 5,912,802 A | * | 6/1999 | Nelson | 361/695 |
| 6,279,648 B1 | | 8/2001 | Diels et al. | |

FOREIGN PATENT DOCUMENTS

| | | |
|---|---|---|
| DE | 35 18 310 | 5/1989 |
| WO | WO 97/27619 | 7/1997 |

* cited by examiner

*Primary Examiner*—I. Cuda-Rosenbaum
(74) *Attorney, Agent, or Firm*—Collard & Roe, P.C.

(57) ABSTRACT

A method for manufacturing cooling devices for mounting on semiconductor devices. These cooling devices are made from several extruded shaped section part elements. These shaped section part elements are made from an aluminum alloy and have grooves and bead strips wherein these grooves and bead strips are fitted into each other by applying pressure in a transverse direction. The outward protruding groove walls of the shaped section elements or the bead strips are pushed into the corresponding grooves of neighboring shaped section elements. These groove walls or bead strips plastically deform by bending in so that each bead strip entering its associated groove is physically locked in place. In addition wires of high purity aluminum can be inserted into these grooves before the groove walls or the bead strips are compacted into their associated grooves. Through this method the connection points become liquid proof and the connection is securely formed in the perpendicular direction.

4 Claims, 2 Drawing Sheets

METHOD OF THE MANUFACTURE OF COOLING DEVICES

BACKGROUND

This invention relates to a method for manufacturing cooling devices. More particularly, this method relates to a method for manufacturing cooling devices that are made from metal shaped section part elements.

Methods for manufacturing cooling devices are known in the art. For example, WO 97/27619 discloses a method for manufacturing several shaped metal elements forming a cooling device which is incorporated herein by reference. This cooling device is mounted onto semi-conductor components. The section part elements have a plurality of grooves and bead strips that fit into them. The section part elements are fitted into each other by applying pressure in a transverse direction.

In addition, these shaped metal elements are formed as extruded sections. The outward protruding groove walls of these shaped section elements or the bead strips are pushed inwards into the corresponding grooves of the neighboring shaped-section part elements, bending inwards and deforming plastically so that each bead strip entering its associated groove is physically locked in place.

The connection for these shaped elements only works if the wall strengths of the bead strips and grooves plugged into each other are sufficiently great. Thus, it is necessary to have high compressive forces for the deformation of these bead strips. In addition these connection points between the bead strips and the grooves are not liquid proof, so that these cooling devices can only be used if gaseous cooling agents are led through.

To overcome this problem the present invention sets forth a method for manufacturing a cooling device that has a liquid proof connection of the shaped section part elements which results in a sufficiently stable connection with a minimum required wall strength of the connecting sections.

SUMMARY

The invention relates to a method for manufacturing a cooling device made from shaped section part elements that has a liquid proof connection which results in a sufficiently stable connection. This method results in a minimum required wall strength for these connecting sections. This method is at least partially achieved by laying wires of high-purity aluminum in the corresponding grooves and subsequently molding these wires together with the bead strips that are to be pressed in the connecting sections. These wires are plastically deformed and fill the remaining gaps.

The plastically deformed wire adheres to the surface of the shaped section by means of cold welding and this process leads to an adhering and sealed connection. This results in a high-quality, liquid-proof connection of the shaped section part elements in a longitudinal direction. Thus the result is that the whole shaped-section element component becomes much more stable.

Because this method uses soft wire there is a reduction in the pressure needed for plastic deformation. Thus, there are fewer relatively high forming forces needed which are caused by an edge rolling die. In addition, the shaped section elements that support the deformation forces can be more easily built. In addition to saving weight, this results in a better transmission of heat.

Highly pure (99.9% purity) annealed aluminum wire should be used with this method. These wires can have a diameter of 1–1.5 mm and can be molded into the connection gaps that are formed without having the material emerge on the outside.

Overall, the intimate connections between the shaped elements have better heat transmission values in the area of these connection points. In addition as stated earlier, another benefit is that the high compression forces needed to form this cooling device can be reduced.

BRIEF DESCRIPTION OF THE DRAWINGS

Other objects and features of the present invention will become apparent from the following detailed description considered in connection with the accompanying drawings which disclose at least one embodiment of the present invention. It should be understood, however, that the drawings are designed for the purpose of illustration only and not as a definition of the limits of the invention.

In the drawings, wherein similar reference characters denote similar elements throughout the several views.

DETAILED DESCRIPTION

Figure 1:
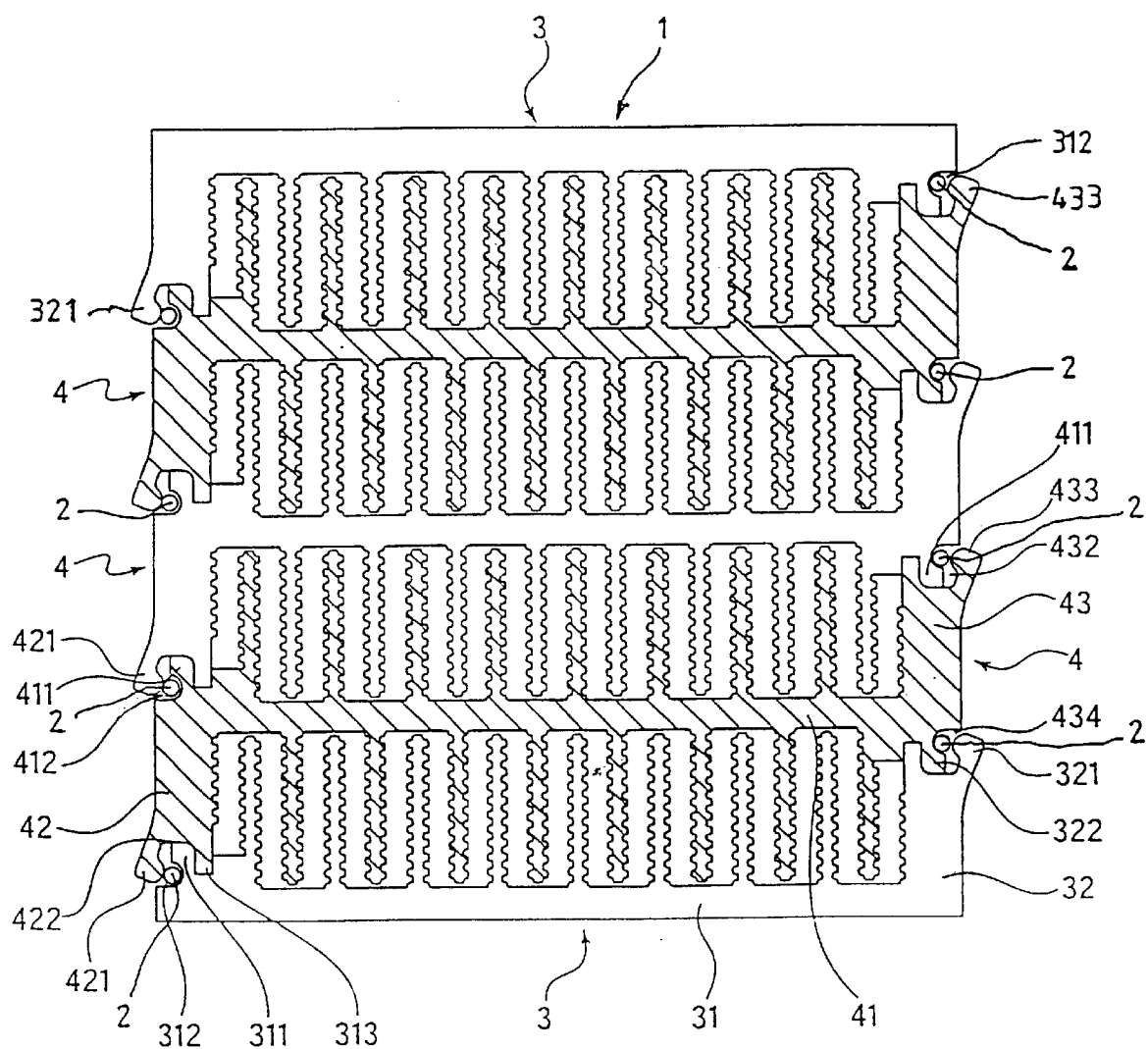
FIG. 1 is a cross sectional view of the mounting arrangement of several shaped section part elements before the step of molding the connection points.
Figure 2:
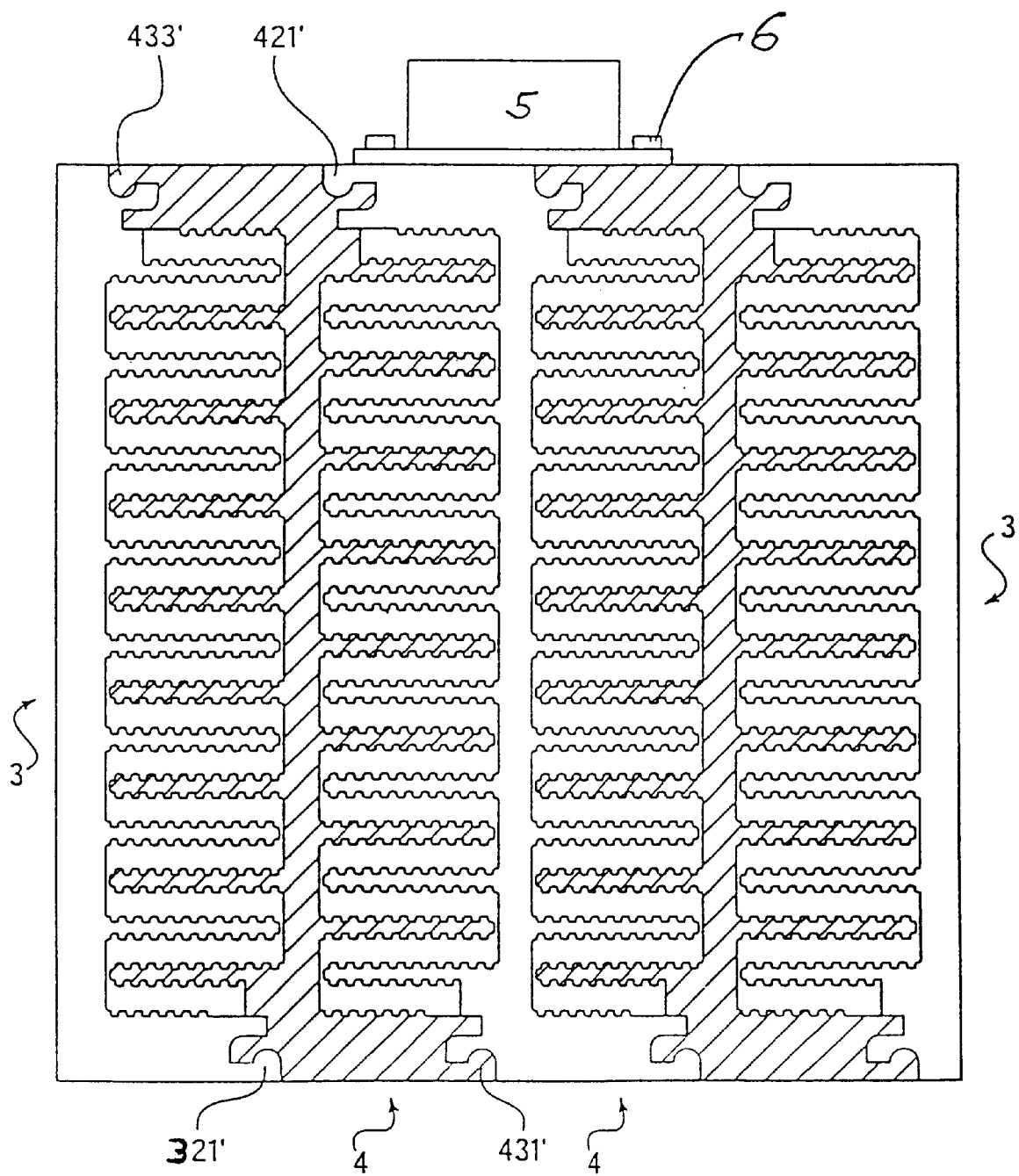
FIG. 2 is a cross sectional view of the layout of FIG. 1 after the bead strips are molded and protrude outwardly into the corresponding grooves.

Referring to the drawings, FIG. 1 shows a cooling device 1 that is produced from a plurality of L-shaped section part elements 3 and at least one Z-shaped section part element 4. FIG. 2 shows that the side of this connected cooling device 1 is attached to a semi-conductor component 5 with a screw connection 6 after a corresponding cutting treatment.

As shown in both FIGS. 1 and 2 extruded shaped section part elements 3 and 4 have parallel spaced bridge like cooling ribs which form cooling surfaces in the interior of the cooling chambers. Two L-shaped section part elements 3 located on the outside, have a bead strip 311 on the end of section wall 31 and a plurality of grooves 312 and 313 directly adjacent. On the front side of another section wall 32 is a groove 322. Bead strip 321, which forms the groove wall of groove 322, (See FIG. 1) protrudes outward at first.

Z-shaped section part elements 4, which can be attached to an adjacent section part element consist of a middle section wall 41 having cooling ribs shaped perpendicular on both sides. Section walls 42 and 43 are arranged on an end side. On a front side of section walls 42 and 43 are grooves 422 and 432 which are confined by outwardly protruding bead strips 421 and 433. In addition bead strips 311 and 411 of adjacent shaped section part elements 3 and 4 engage in grooves 422 and 432 respectively.

Wires 2 of high purity aluminum are inserted frontally into grooves 312, 412, and 434. A rolling or embossing process can be used to mold soft annealed wires 2 which occurs when bending or molding outwardly protruding bead strips 321, 421, or 433 into grooves 312, 412, or 434 of the neighboring shaped-section part elements. These shaped section part elements 3 and 4 are finally locked into place wherein the plasticized wires 2 shape themselves into remaining gaps. This results in the shaped section elements being completely liquid proof at these connection points. This intimate liquid-proof connection increases the coefficient of friction so that the shaped-section elements are connected lengthwise with each other and will not slide.

These wires should have a gauge of 1–3 mm but preferably 1–1.5 mm.

FIG. 2 shows a connection side of a hollow chamber section element 1 which is formed after a corresponding cutting process. There is also a shown a level and flat contact surface for a semiconductor component 5. With this view, the corresponding grooves and the compressed bead strips are shown by reference numerals 321', 421', 431', and 433' respectively.

Accordingly, while at least one embodiment of the present invention has been shown and described, it is to be understood that many changes and modifications may be made thereunto without departing from the spirit and scope of the invention as defined in the appended claims.

What is claimed is:

1. A method for manufacturing cooling devices for semiconductor components, in which the devices are made from several extruded shaped-section part elements of aluminum alloy having grooves formed from outward protruding groove walls and bead strips, the method comprising the steps of:

inserting at least one wire of high purity aluminum or aluminum alloy into the grooves;

fitting said section part elements together by applying pressure in a transverse direction to a longitudinal axis of said extruded shaped-section part elements;

pushing the outward protruding groove walls of the shaped section part elements or the bead strips into adjacent corresponding grooves of one or more neighboring section part elements;

bending inward and deforming plastically said groove walls of said section part elements or bead strips and said at least one wire so that each bead strip entering an associated groove is physically locked in place and said at least one wire is compacted into its associated groove.

2. The method as in claim 1, wherein said step of inserting at least one wire comprises inserting at least one wire comprising aluminum having a purity content of 99.9%.

3. The method as in claim 2, wherein said step of inserting at least one wire comprises inserting at least one wire having a diameter between 1 and 1.5 mm.

4. The method as in claim 1, wherein said step of inserting at least one wire comprises inserting at least one wire having a diameter between 1 and 1.5 mm.

* * * * *